US011133781B2

United States Patent
Nakatani et al.

(10) Patent No.: US 11,133,781 B2
(45) Date of Patent: Sep. 28, 2021

(54) DOHERTY AMPLIFIER AND DOHERTY AMPLIFIER CIRCUIT

(71) Applicant: Mitsubishi Electric Corporation, Tokyo (JP)

(72) Inventors: Keigo Nakatani, Tokyo (JP); Yuji Komatsuzaki, Tokyo (JP); Shuichi Sakata, Tokyo (JP); Shintaro Shinjo, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/845,750

(22) Filed: Apr. 10, 2020

(65) Prior Publication Data

US 2020/0244227 A1    Jul. 30, 2020

Related U.S. Application Data (63) Continuation of application No. PCT/JP2017/041109, filed on Nov. 15, 2017.

(51) Int. Cl.
| H03F 1/07 | (2006.01) |
| H03F 1/56 | (2006.01) |
| H03F 3/21 | (2006.01) |
| H03F 3/68 | (2006.01) |

(52) U.S. Cl.
CPC .............. *H03F 1/07* (2013.01); *H03F 1/56* (2013.01); *H03F 3/211* (2013.01); *H03F 3/68* (2013.01); *H03F 2200/222* (2013.01); *H03F 2200/255* (2013.01)

(58) Field of Classification Search
CPC ....................................................... H03F 1/07
See application file for complete search history.

(56) References Cited

U.S. PATENT DOCUMENTS

| 7,345,535 | B2* | 3/2008 | Kwon | ............. | H03F 1/0205 |
| | | | | | 330/124 R |
| 8,487,703 | B2* | 7/2013 | Blednov | ............. | H03F 3/211 |
| | | | | | 330/295 |
| 9,634,615 | B1 | 4/2017 | Ahmed et al. | | |
| 2008/0187035 | A1* | 8/2008 | Nakamura | ............. | H03F 3/245 |
| | | | | | 375/232 |
| 2012/0025915 | A1 | 2/2012 | Ui | | |
| 2012/0025916 | A1* | 2/2012 | Deguchi | ............. | H03F 3/195 |
| | | | | | 330/295 |

(Continued)

FOREIGN PATENT DOCUMENTS

| JP | 2012-29239 A | 2/2012 |
| JP | 2013-121030 A | 6/2013 |

OTHER PUBLICATIONS

Extended European Search Report for European Application No. 17932410.8, dated Oct. 1, 2020.

*Primary Examiner* — Patricia T Nguyen
(74) *Attorney, Agent, or Firm* — Birch, Stewart, Kolasch & Birch, LLP (57) ABSTRACT

Included is a compensation circuit having one end connected to another end of a first output circuit and another end of a second output circuit and another end grounded, the compensation circuit having an electrical length of 90 degrees at a first operation frequency and an electrical length of 45 degrees at a second operation frequency which is half of the first operation frequency.

5 Claims, 4 Drawing Sheets

(56) References Cited

U.S. PATENT DOCUMENTS

| | | | |
|---|---|---|---|
| 2013/0149979 A1 | 6/2013 | Kimura et al. | |
| 2014/0035681 A1* | 2/2014 | Boumaiza | G06F 30/39 |
| | | | 330/295 |
| 2018/0191309 A1* | 7/2018 | McLaren | H03F 3/245 |
| 2019/0149097 A1* | 5/2019 | Komatsuzaki | H03F 1/07 |
| | | | 330/124 R |

* cited by examiner

DOHERTY AMPLIFIER AND DOHERTY AMPLIFIER CIRCUIT

CROSS REFERENCE TO RELATED APPLICATIONS

This application is a Continuation of PCT International Application No. PCT/JP2017/041109, filed on Nov. 15, 2017, all of which is hereby expressly incorporated by reference into the present application.

TECHNICAL FIELD

The present invention relates to a Doherty amplifier including first and second amplification elements and a Doherty amplifier circuit including a plurality of Doherty amplifiers.

BACKGROUND ART

There are cases where Doherty amplifiers are used as, for example, an amplifier for wireless communication.

A Doherty amplifier includes a carrier amplifier and a peak amplifier and outputs a composite signal of an output signal of the carrier amplifier and an output signal of the peak amplifier.

The carrier amplifier amplifies an input signal regardless of the power of the input signal, and the peak amplifier amplifies an input signal only when the power of the input signal is greater than or equal to a predetermined power.

Patent Literature 1 below discloses a Doherty amplifier circuit including a plurality of Doherty amplifiers having different applicable operation frequencies in order to be able to amplify a signal over a wide band.

The Doherty amplifier circuit includes a switch that switches Doherty amplifiers, to which an input signal is supplied, among the plurality of Doherty amplifiers depending on the operation frequency of the input signal.

CITATION LIST

Patent Literatures

Patent Literature 1: JP 2012-029239 A

SUMMARY OF INVENTION

Technical Problem

Conventional Doherty amplifiers have disadvantages that the applicable operation frequency is limited to a single frequency and that a signal having two operation frequencies cannot be amplified.

Conventional Doherty amplifier circuits needs to include a plurality of Doherty amplifiers having different applicable operation frequencies in order to be able to amplify a signal over a wide band, and it is necessary to include a switch for switching Doherty amplifiers, to which an input signal is supplied, among the plurality of Doherty amplifiers depending on the operation frequency of the input signal. For this reason, there is a disadvantage that the circuit becomes large.

The present invention has been devised in order to solve the disadvantages as described above, and an object of the present invention is to obtain a Doherty amplifier capable of amplifying a signal having two operation frequencies.

Another object of the present invention is to obtain a Doherty amplifier circuit capable of amplifying a signal having two operation frequencies without including a plurality of Doherty amplifiers having different applicable operation frequencies and a switch for switching Doherty amplifiers, to which an input signal is supplied, among the plurality of Doherty amplifiers.

Solution to Problem

A Doherty amplifier according to the present invention includes: a first input circuit having an electrical length of 180×n (n is an integer greater than or equal to 1) degrees at a first operation frequency of first and second signals that are signals to be amplified; a second input circuit having an electrical length of 90 degrees at the first operation frequency; a first amplification element for amplifying the first signal that has passed through the first input circuit; a second amplification element for amplifying the second signal that has passed through the second input circuit; a first output circuit having one end connected to an output terminal of the first amplification element, the first output circuit having an electrical length of 90 degrees at the first operation frequency; a second output circuit having one end connected to an output terminal of the second amplification element and another end connected to another end of the first output circuit, the second output circuit having an electrical length of 180×n degrees at the first operation frequency; a compensation circuit having one end connected to the other ends of the first and second output circuits and another end grounded, the compensation circuit having an electrical length of 90 degrees at the first operation frequency and an electrical length of 45 degrees at a second operation frequency which is half of the first operation frequency; and a controller to switch between operating classes of the first and second amplification elements when operation frequencies of the first and second amplification elements are the first operation frequency and operating classes of the first and second amplification elements when the operation frequencies of the first and second amplification elements are the second operation frequency.

Advantageous Effects of Invention

According to the present invention, the configuration includes the compensation circuit having one end connected to the other ends of the first and second output circuits and the other end grounded, the compensation circuit having an electrical length of 90 degrees at the first operation frequency and an electrical length of 45 degrees at the second operation frequency which is half of the first operation frequency, and thus there is an effect that a signal of two operation frequencies can be amplified.

DESCRIPTION OF EMBODIMENTS

To describe the present invention further in detail, embodiments for carrying out the present invention will be described below with reference to the accompanying drawings.

First Embodiment

Figure 1:
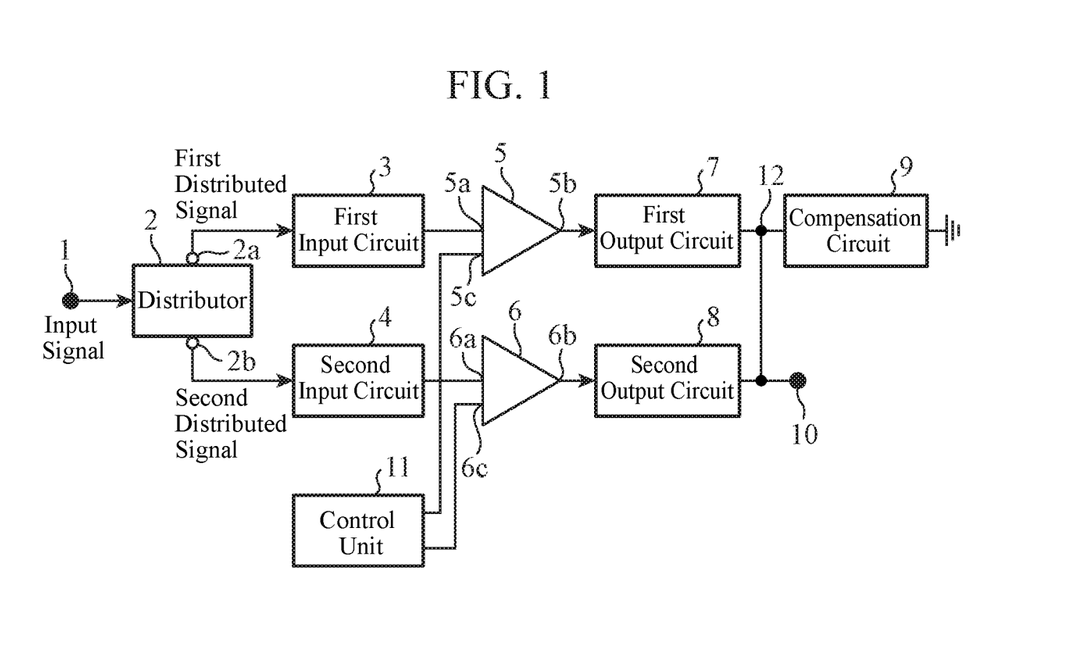
FIG. 1 is a configuration diagram illustrating a Doherty amplifier according to a first embodiment of the present invention.

FIG. 1 is a configuration diagram illustrating a Doherty amplifier according to a first embodiment of the invention.

In FIG. 1, an input terminal 1 is a terminal to which a signal to be amplified (hereinafter referred to as an input signal) is input.

A distributor 2 is implemented by, for example, a Wilkinson power distributor, and is a circuit that divides the input signal input from the input terminal 1 into two.

The distributor 2 outputs one of the distributed signals from a first output terminal 2a to a first input circuit 3 as a first distributed signal (first signal), and outputs the other one of the distributed signals from a second output terminal 2b to a second input circuit 4 as a second distributed signal (second signal).

Although it is assumed in the first embodiment that the amplitude of the first distributed signal output from the distributor 2 to the first input circuit 3 and the amplitude of the second distributed signal output from the distributor 2 to the second input circuit 4 are the same, the amplitude of the first distributed signal may be different from the amplitude of the second distributed signal.

The first input circuit 3 has one end connected to the first output terminal 2a of the distributor 2 and the other end connected to an input terminal 5a of a first amplification element 5, and has an electrical length of 180×n (n is an integer greater than or equal to 1) degrees at a first operation frequency $F_0$ of the input signal.

The first input circuit 3 is a circuit for supplying the first distributed signal output from the first output terminal 2a of the distributor 2 to the first amplification element 5 without loss, and is implemented by, for example, a lumped parameter element, a distributed constant element, a π-type circuit, a T-type circuit, or a combination of these elements or circuits.

For convenience of explanation, it is assumed in the first embodiment that n=1 and that the first input circuit 3 has an electrical length of 180 degrees at the first operation frequency $F_0$.

The second input circuit 4 has one end connected to the second output terminal 2b of the distributor 2 and the other end connected to an input terminal 6a of a second amplification element 6, and has an electrical length of 90 degrees at the first operation frequency $F_0$ of the input signal.

The second input circuit 4 is a circuit for supplying the second distributed signal output from the second output terminal 2b in the distributor 2 to the second amplification element 6 without loss, and is implemented by, for example, a lumped parameter element, a distributed constant element, a π-type circuit, a T-type circuit, or a combination of these elements or circuits.

The first amplification element 5 amplifies the first distributed signal that has passed through the first input circuit 3.

In a case where the operation frequency of the input signal is the first operation frequency $F_0$, the first amplification element 5 operates, for example, as a carrier amplifier that operates at class AB, and in a case where the operation frequency of the input signal is a second operation frequency $F_0/2$, which is a half of the first operation frequency $F_0$, the first amplification element 5 operates, for example, as a peak amplifier that operates at class C.

The first amplification element 5 is implemented by, for example, a field-effect transistor (FET) or an amplification circuit including an FET and an impedance conversion circuit.

The second amplification element 6 amplifies the second distributed signal that has passed through the second input circuit 4.

In a case where the operation frequency of the input signal is the first operation frequency $F_0$, the second amplification element 6 operates, for example, as a peak amplifier that operates at class C, and in a case where the operation frequency of the input signal is the second operation frequency $F_0/2$, the second amplification element 6 operates, for example, as a carrier amplifier that operates at class AB.

The second amplification element 6 is implemented by, for example, an FET or an amplification circuit including an FET and an impedance conversion circuit.

A first output circuit 7 has one end connected to an output terminal 5b of the first amplification element 5 and the other end connected to a combining point 10, and has an electrical length of 90 degrees at the first operation frequency $F_0$ of the input signal.

The first output circuit 7 is a circuit for transmitting the amplified first distributed signal output from the output terminal 5b of the first amplification element 5 to the combining point 10, and is implemented by, for example, a lumped parameter element, a distributed constant element, a π-type circuit, a T-type circuit, or a combination of these elements or circuits.

A second output circuit 8 has one end connected to an output terminal 6b of the second amplification element 6 and the other end connected to the combining point 10, and has an electrical length of 180×n (n is an integer greater than or equal to 1) degrees at the first operation frequency $F_0$ of the input signal.

The second output circuit 8 is a circuit for transmitting the amplified second distributed signal output from the output terminal 6b of the second amplification element 6 to the combining point 10, and is implemented by, for example, a lumped parameter element, a distributed constant element, a π-type circuit, a T-type circuit, or a combination of these elements or circuits.

For convenience of explanation, it is assumed in the first embodiment that n=1 and that the second output circuit 8 has an electrical length of 180 degrees at the first operation frequency $F_0$.

A compensation circuit 9 has one end connected to the other end of the first output circuit 7 and the other end of the second output circuit 8, and the other end grounded, and has an electrical length of 90 degrees at the first operation frequency $F_0$ of the input signal and an electrical length of 45 degrees at the second operation frequency $F_0/2$ of the input signal.

The compensation circuit 9 is implemented by, for example, a lumped parameter element, a distributed constant element, a π-type circuit, a T-type circuit, or a combination of these elements or circuits.

Although the example has been described in the first embodiment in which the compensation circuit 9 has an electrical length of 45 degrees at the second operation frequency $F_0/2$ of the input signal, the electrical length of the compensation circuit 9 is not necessarily be exactly 45 degrees at the second operation frequency $F_0/2$ but is only required to be approximately 45 degrees. For this reason, the electrical length of the compensation circuit 9 includes electrical lengths around 45 degrees at the second operation frequency $F_0/2$.

The combining point 10 is a point where the first distributed signal amplified by the first amplification element 5 that has passed through the first output circuit 7 and the second distributed signal amplified by the second amplification element 6 that has passed through the second output circuit 8 are combined.

A matching circuit for transmitting the signal to a load (not illustrated) is connected as a subsequent stage of the combining point 10.

A control unit 11 is connected to a control terminal 5c of the first amplification element 5 and a control terminal 6c of the second amplification element 6.

The control unit 11 is a circuit for switching the operation classes of the first amplification element 5 and the second amplification element 6 when the operation frequency of the input signal is the first operation frequency $F_0$, and for switching the operation classes of the first amplification element 5 and the second amplification element 6 when the operation frequency of the input signal is the second operation frequency $F_0/2$.

For example, when the operation frequency of the input signal is the first operation frequency $F_0$, the control unit 11 controls the first amplification element 5 and the second amplification element 6 so that the first amplification element 5 operates as a carrier amplifier that operates at class AB and that the second amplification element 6 operates as a peak amplifier that operates at class C.

Moreover, when the operation frequency of the input signal is the second operation frequency $F_0/2$, the control unit 11 controls the first amplification element 5 and the second amplification element 6 so that the first amplification element 5 operates as a peak amplifier that operates at class C and that the second amplification element 6 operates as a carrier amplifier that operates at class AB.

A connection point 12 is a point where the first output circuit 7 and the compensation circuit 9 are connected.

Next, the operation will be described.

When the operation frequency of the input signal is the first operation frequency $F_0$, the control unit 11 controls the first amplification element 5 and the second amplification element 6 so that the first amplification element 5 operates as a carrier amplifier that operates at class AB and that the second amplification element 6 operates as a peak amplifier that operates at class C.

Figure 2:
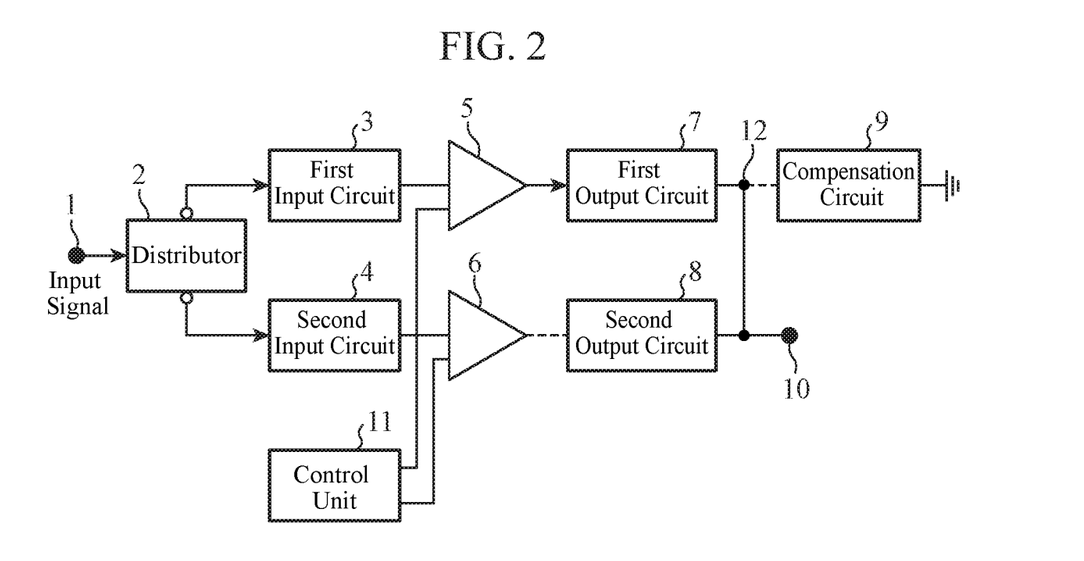
FIG. 2 is an equivalent circuit of the Doherty amplifier of FIG. 1 during back-off operation when the operation frequency of an input signal is a first operation frequency $F_0$.

FIG. 2 is an equivalent circuit of the Doherty amplifier of FIG. 1 during back-off operation when the operation frequency of an input signal is the first operation frequency $F_0$.

When the operation frequency of the input signal is the first operation frequency $F_0$, the compensation circuit 9 operates as a short stub having an electrical length of 90 degrees, and thus is an open end with respect to the connection point 12.

Therefore, the compensation circuit 9 does not affect the Doherty amplifier.

In FIG. 2, in order to clearly illustrate that the compensation circuit 9 is an open end with respect to the connection point 12, the portion between the compensation circuit 9 and the connection point 12 is indicated by a broken line.

Since the subsequent stage of the second amplification element 6 operating as a peak amplifier has a high impedance during back-off operation, an open end is equivalently obtained between the second amplification element 6 and the second output circuit 8.

In FIG. 2, in order to clearly illustrate that an open end is equivalently obtained between the second amplification element 6 and the second output circuit 8, the connection between the second amplification element 6 and the second output circuit 8 is illustrated by a broken line.

Since the second output circuit 8 has the electrical length of 180 degrees at the first operation frequency $F_0$, the second output circuit 8 does not affect impedance transformation with respect to the combining point 10.

When the operation frequency of the input signal is the first operation frequency $F_0$, the first input circuit 3 has the electrical length of 180 degrees, and the second input circuit 4 has an electrical length of 90 degrees. Therefore, the phase relationship during back-off operation and the phase relationship at the time of saturation satisfy the condition for operation as a Doherty amplifier. Since the conditions for operation as a Doherty amplifier are known per se, detailed description thereof will be omitted.

Therefore, when the operation frequency of the input signal is the first operation frequency $F_0$, the input signal is amplified by the Doherty amplifier of FIG. 1.

When the operation frequency of the input signal is the second operation frequency $F_0/2$, the control unit 11 controls the first amplification element 5 and the second amplification element 6 so that the first amplification element 5 operates as a peak amplifier that operates at class C and that the second amplification element 6 operates as a carrier amplifier that operates at class AB.

Figure 3:
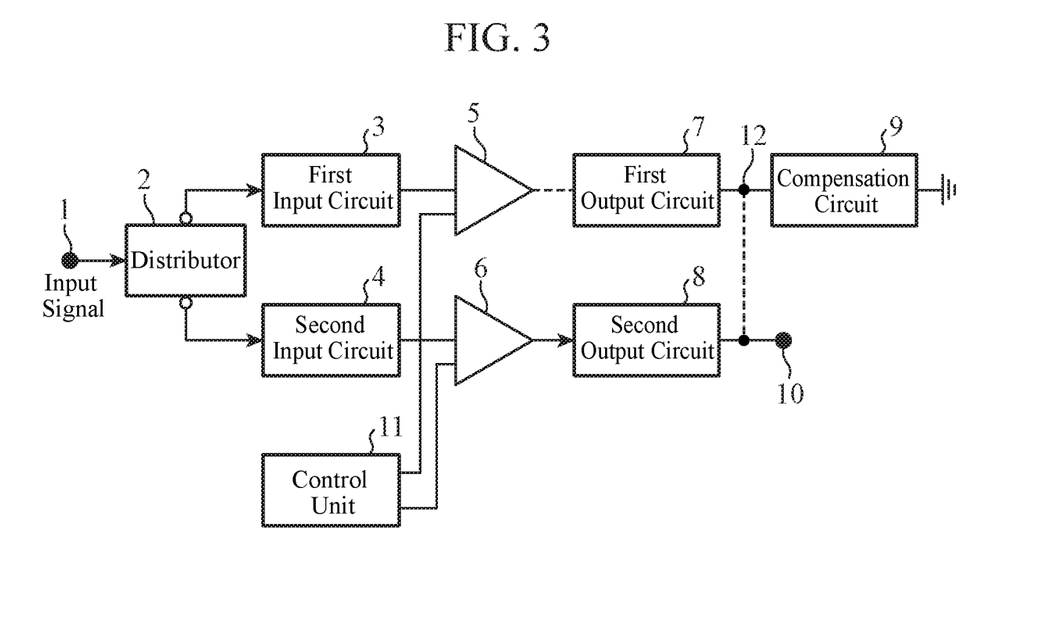
FIG. 3 is an equivalent circuit of the Doherty amplifier of FIG. 1 during back-off operation when the operation frequency of an input signal is a second operation frequency $F_0/2$.

FIG. 3 is an equivalent circuit of the Doherty amplifier of FIG. 1 during back-off operation when the operation frequency of an input signal is the second operation frequency $F_0/2$.

When the operation frequency of the input signal is the second operation frequency $F_0/2$, the compensation circuit 9 is equivalent to a short stub having an electrical length of 45 degrees.

Since the subsequent stage of the first amplification element 5 operating as a peak amplifier has a high impedance during back-off operation, an open end is equivalently obtained between the first amplification element 5 and the first output circuit 7.

In FIG. 3, in order to clearly illustrate that an open end is equivalently obtained between the first amplification element 5 and the first output circuit 7, the connection between the first amplification element 5 and the first output circuit 7 is illustrated by a broken line.

As a result, the first output circuit 7 and the compensation circuit 9 resonate, and thus the compensation circuit 9 cancels the electrical length of the first output circuit 7.

As a result, the capacitive impedance in the first output circuit 7 and the inductive impedance in the compensation circuit 9 cancel out each other. Therefore, the first output circuit 7 and the compensation circuit 9 are not equivalently connected to the combining point 10.

In FIG. 3, in order to clearly illustrate that the first output circuit 7 and the compensation circuit 9 are not equivalently connected to the combining point 10, the connection between the connection point 12 and the combining point 10 is illustrated by a broken line.

When the operation frequency of the input signal is the second operation frequency $F_0/2$, the second output circuit 8 has the electrical length of 90 degrees, and thus the phase relationship during back-off operation and the phase relationship at the time of saturation satisfy the condition for operation as a Doherty amplifier.

Therefore, when the operation frequency of the input signal is the second operation frequency $F_0/2$, the input signal is amplified by the Doherty amplifier of FIG. 1.

As described above, the Doherty amplifier illustrated in FIG. 1 can implement dual-band operation that enables amplification in either case where the frequency of the input signal is the first operation frequency $F_0$ or the second operation frequency $F_0/2$.

Figure 4:
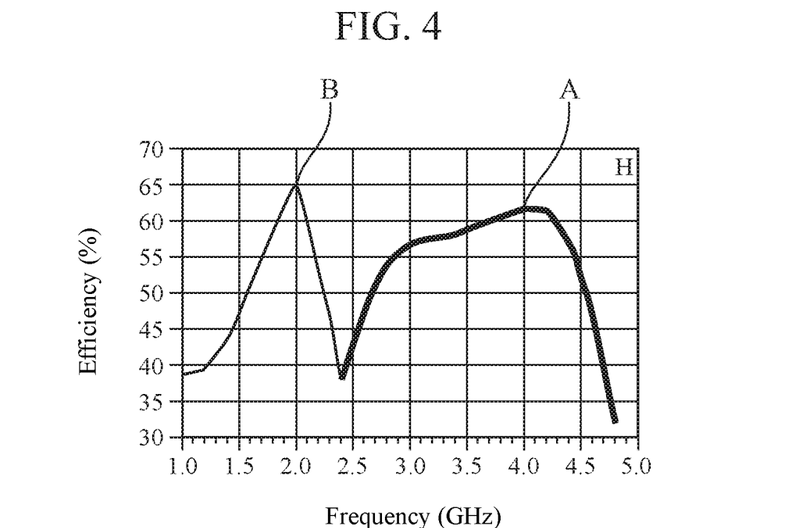
FIG. 4 is an explanatory diagram illustrating power efficiency with respect to the frequency during back-off operation in the Doherty amplifier of FIG. 1.

FIG. 4 is an explanatory diagram illustrating power efficiency with respect to the frequency during back-off operation in the Doherty amplifier of FIG. 1.

In FIG. 4, an example of the power efficiency A at the first operation frequency $F_0$ and the power efficiency B at the second operation frequency $F_0/2$ is illustrated.

As illustrated in FIG. 4, it is understood that the Doherty amplifier of FIG. 1 enables high efficiency characteristics regardless of whether the operation frequency of the input signal is the first operation frequency $F_0$ or the second operation frequency $F_0/2$.

Here, FIG. 5 includes diagrams illustrating configuration examples of the compensation circuit 9 of the Doherty amplifier according to the first embodiment of the present invention.

Figure 5A:
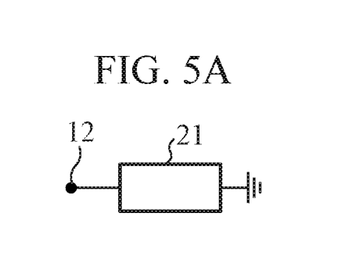
FIG. 5A is a configuration diagram illustrating an example in which a compensation circuit 9 is a transmission line 21 having one end connected to a connection point 12 and the other end grounded.

FIG. 5A is a configuration diagram illustrating an example in which the compensation circuit 9 is a transmission line 21 having one end connected to the connection point 12 and the other end grounded.

Figure 5B:
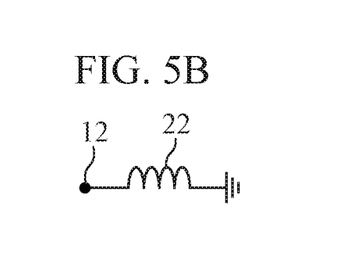
FIG. 5B is a configuration diagram illustrating an example in which the compensation circuit 9 is an inductor 22 having one end connected to the connection point 12 and the other end grounded.

FIG. 5B is a configuration diagram illustrating an example in which the compensation circuit 9 is an inductor 22 having one end connected to the connection point 12 and the other end grounded.

Figure 5C:
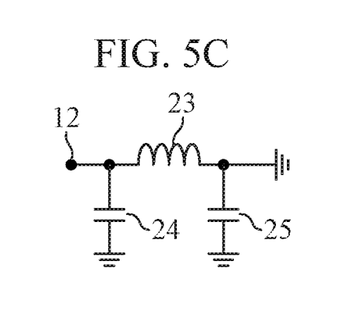
FIG. 5C is a configuration diagram illustrating an example in which the compensation circuit 9 includes an inductor 23 and capacitors 24 and 25.

FIG. 5C is a configuration diagram illustrating an example in which the compensation circuit 9 includes an inductor 23 and capacitors 24 and 25.

In FIG. 5C, the inductor 23 has one end connected to the connection point 12 and the other end grounded.

The capacitor 24 has one end connected to the connection point 12 and the other end grounded.

The capacitor 25 has one end connected to the other end of the inductor 23 and the other end grounded.

Figure 5D:
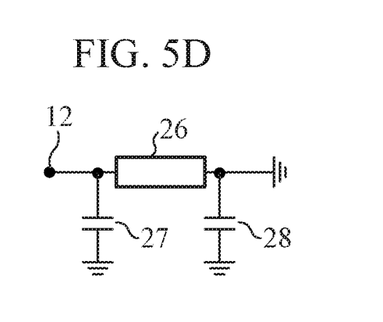
FIG. 5D is a configuration diagram illustrating an example in which the compensation circuit 9 includes a transmission line 26 and capacitors 27 and 28.

FIG. 5D is a configuration diagram illustrating an example in which the compensation circuit 9 includes a transmission line 26 and capacitors 27 and 28.

In FIG. 5D, the transmission line 26 has one end connected to the connection point 12 and the other end grounded.

The capacitor 27 has one end connected to the connection point 12 and the other end grounded.

The capacitor 28 has one end connected to the other end of the transmission line 26 and the other end grounded.

As apparent from the above, according to the first embodiment, the configuration includes the compensation circuit 9 having one end connected to the other end of the first output circuit 7 and the other end of the second output circuit 8 and the other end grounded, the compensation circuit 9 having an electrical length of 90 degrees at the first operation frequency and an electrical length of 45 degrees at the second operation frequency which is half of the first operation frequency, and thus there is an effect that a signal of two operation frequencies can be amplified.

Second Embodiment

Figure 6:
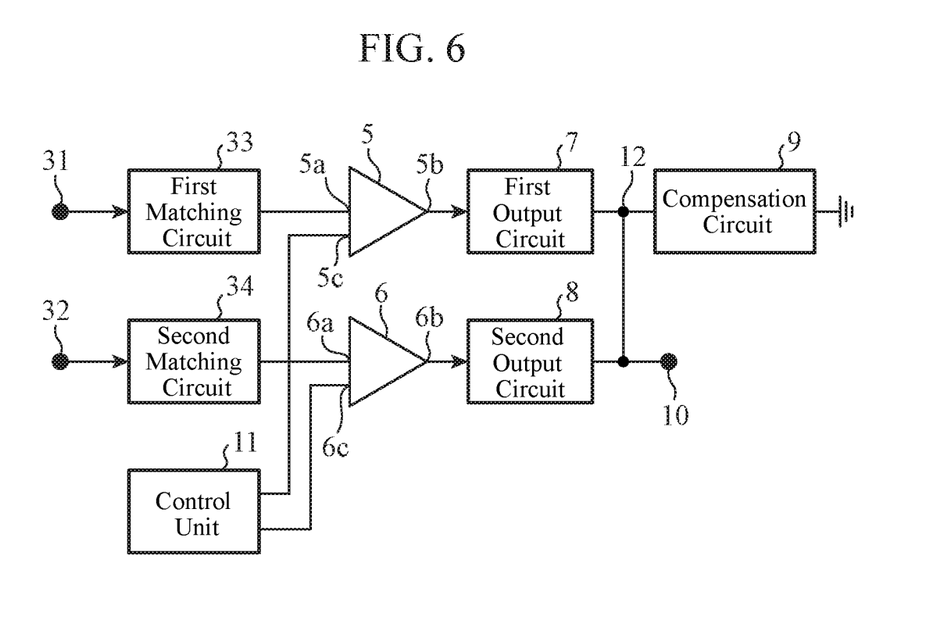
FIG. 6 is a configuration diagram illustrating a Doherty amplifier according to a second embodiment of the present invention.

In the first embodiment, the Doherty amplifier including the first input circuit 3 and the second input circuit 4 has been described. Meanwhile, in a second embodiment, a Doherty amplifier including a first matching circuit 33 instead of the first input circuit 3 and a second matching circuit 34 instead of the second input circuit 4 will be described.

FIG. 6 is a configuration diagram illustrating a Doherty amplifier according to the second embodiment of the invention. In FIG. 6, the same symbol as that in FIG. 1 represents the same or a corresponding part, and thus description thereof is omitted.

An input terminal 31 is a terminal to which a first signal that is a signal to be amplified is input, and the first signal input from the input terminal 31 is input to a first input circuit 3. The first signal corresponds to the first distributed signal in the first embodiment.

An input terminal 32 is a terminal to which a second signal that is a signal to be amplified is input, and the second signal input from the input terminal 32 is input to a second input circuit 4. The second signal corresponds to the second distributed signal in the first embodiment.

In the second embodiment, the phase of the first signal input from the input terminal 31 is 90 degrees behind the phase of the second signal input from the input terminal 32 at the first operation frequency $F_0$ and is 45 degrees behind at the second operation frequency $F_0/2$.

In addition, although it is assumed in the second embodiment that the amplitude of the first signal input from the input terminal 31 is the same as the amplitude of the second signal input from the input terminal 32, the amplitude of the first signal may be different from the amplitude of the second signal.

The first matching circuit 33 is inserted between the input terminal 31 and an input terminal 5a of a first amplification element 5 and changes the input impedance of the first amplification element 5.

The second matching circuit 34 is inserted between the input terminal 32 and an input terminal 6a of a second amplification element 6 and changes the input impedance of the second amplification element 6.

Next, the operation will be described.

Since the first matching circuit 33 is inserted between the input terminal 31 and the input terminal 5a of the first amplification element 5, the first signal input from the input terminal 31 is transmitted to the input terminal 5a of the first amplification element 5.

Likewise, since the second matching circuit 34 is inserted between the input terminal 32 and the input terminal 6a of the second amplification element 6, the second signal input from the input terminal 32 is transmitted to the input terminal 6a of the second amplification element 6.

In the second embodiment, the phase of the first signal input from the input terminal 31 is 90 degrees behind the phase of the second signal input from the input terminal 32 at the first operation frequency $F_0$ and is 45 degrees behind at the second operation frequency $F_0/2$.

Therefore, the phase of the first signal input from the input terminal 5a of the first amplification element 5 is 90 degrees behind the phase of the second signal input from the input terminal 6a of the second amplification element 6 at the first operation frequency $F_0$ and is 45 degrees behind at the second operation frequency $F_0/2$ like in the first embodiment described above.

Other operations are similar to that in the first embodiment, and thus detailed description is omitted.

As is apparent from the above, in the case where the first matching circuit 33 is included in place of the first input circuit 3, the second matching circuit 34 is included in place of the second input circuit 4, and the phase of the first signal input from the input terminal 31 is 90 degrees behind the phase of the second signal input from the input terminal 32 at the first operation frequency and 45 degrees behind at the second operation frequency, there is an effect that a signal of two operation frequencies can be amplified like in the first embodiment.

Third Embodiment

In a third embodiment, a Doherty amplifier circuit in which multiple Doherty amplifiers are connected in parallel will be described.

Figure 7:
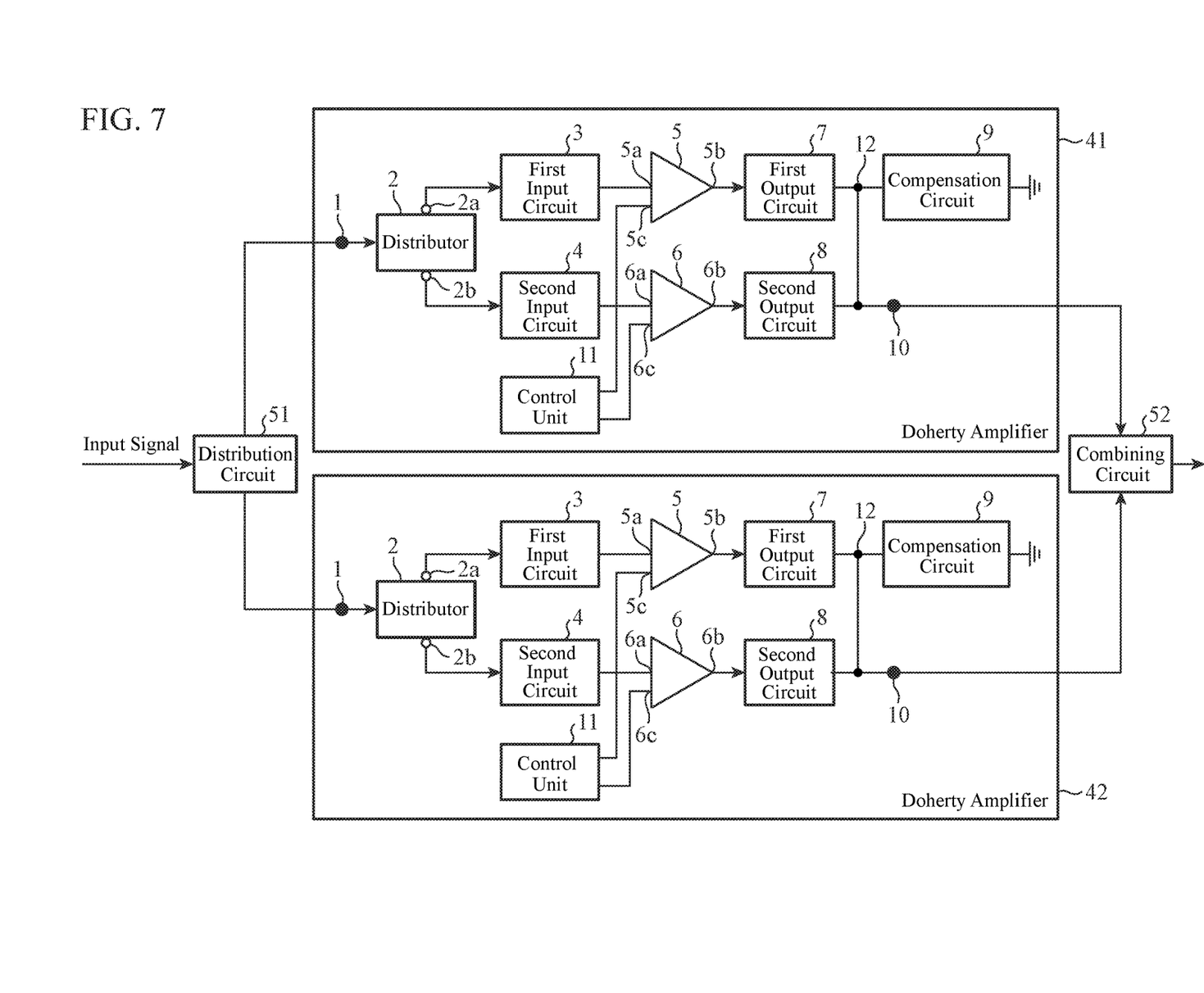
FIG. 7 is a configuration diagram illustrating a Doherty amplifier circuit according to a third embodiment of the present invention.

FIG. 7 is a configuration diagram illustrating a Doherty amplifier circuit according to the third embodiment of the present invention. In FIG. 7, the same symbol as that in FIG. 1 represents the same or a corresponding part, and thus description thereof is omitted.

Doherty amplifiers 41 and 42 have the same configuration as that of the Doherty amplifier of FIG. 1 and have the same applicable operation frequency.

Although an example is described in the third embodiment in which the Doherty amplifier circuit includes the two Doherty amplifiers 41 and 42, three or more Doherty amplifiers may be included.

By connecting multiple Doherty amplifiers having the same applicable operation frequency in parallel, the amplification factor can be increased.

A distribution circuit 51 is implemented by, for example, a Wilkinson power distributor, and is a circuit that divides an input signal into two.

The distribution circuit 51 outputs one of the distributed input signals to the Doherty amplifier 41 as a signal to be amplified, and outputs the other one of the distributed input signals to the Doherty amplifier 42 as a signal to be amplified.

A combining circuit 52 is implemented by, for example, a Wilkinson power combiner, and combines a signal output from the Doherty amplifier 41 and a signal output from the Doherty amplifier 42 and outputs the combined signal.

Next, the operation will be described.

The distribution circuit 51 divides the input signal into two, outputs one of the divided input signal to the Doherty amplifier 41 as a signal to be amplified, and outputs the other one of the divided input signals to the Doherty amplifier 42 as a signal to be amplified.

Since the operation of the Doherty amplifiers 41 and 42 is similar to that in the first embodiment, detailed description thereof is omitted.

A combining circuit 52 combines a signal output from a combining point 10 of the Doherty amplifier 41 and a signal output from the combining point 10 of the Doherty amplifier 42, and outputs the combined signal to the outside.

As is apparent from the above, the third embodiment includes: the distribution circuit 51 for dividing an input signal to multiple signals and outputting each of distributed signals, which are the divided input signals, as signals to be amplified to each of the multiple Doherty amplifiers; and the combining circuit 52 for combining signals output from the multiple Doherty amplifiers, and thus there is an effect that a signal of two operation frequencies can be amplified without including a plurality of Doherty amplifiers having different applicable operation frequencies and a switch for switching Doherty amplifiers, to which an input signal is supplied, among the plurality of Doherty amplifiers like in the first embodiment.

Note that a flexible combination of the respective embodiments, a modification of any component of the embodiments, or an omission of any component in the embodiments can be made in the invention of the present application within the scope of the present invention.

INDUSTRIAL APPLICABILITY

The present invention is suitable for a Doherty amplifier including first and second amplification elements, and is also suitable for a Doherty amplifier circuit including a plurality of Doherty amplifiers.

REFERENCE SIGNS LIST

1: Input terminal, 2: Distributor, 2a: First output terminal, 2b: Second output terminal, 3: First input circuit, 4: Second input circuit, 5: First amplification element, 5a: Input terminal, 5b: Output terminal, 5c: Control terminal, 6: Second amplification element, 6a: Input terminal, 6b: Output terminal, 6c: Control terminal, 7: First output circuit, 8: Second output circuit, 9: Compensation circuit, 10: Combining point, 11: Control unit, 12: Connection point, 21: Transmission line, 22: Inductor, 23: Inductor, 24, 25: Capacitor, 26: Transmission line, 27, 28: Capacitor, 31, 32: Input terminal, 33: First matching circuit, 34: Second matching circuit, 41, 42: Doherty amplifier, 51: Distribution circuit, 52: Combining circuit.

The invention claimed is:

1. A Doherty amplifier comprising:
a first input circuit having an electrical length of 180×n (n is an integer greater than or equal to 1) degrees at a first operation frequency of first and second signals that are signals to be amplified;
a second input circuit having an electrical length of 90 degrees at the first operation frequency;
a first amplification element to amplify the first signal that has passed through the first input circuit;
a second amplification element to amplify the second signal that has passed through the second input circuit;
a first output circuit having one end connected to an output terminal of the first amplification element, the first output circuit having an electrical length of 90 degrees at the first operation frequency;
a second output circuit having one end connected to an output terminal of the second amplification element and another end connected to another end of the first output circuit, the second output circuit having an electrical length of 180×n degrees at the first operation frequency;

a compensation circuit having one end connected to the other ends of the first and second output circuits and another end grounded, the compensation circuit having an electrical length of 90 degrees at the first operation frequency and an electrical length of 45 degrees at a second operation frequency which is half of the first operation frequency; and a controller to switch between operating classes of the first and second amplification elements when operation frequencies of the first and second amplification elements are the first operation frequency and operating classes of the first and second amplification elements when the operation frequencies of the first and second amplification elements are the second operation frequency.

2. The Doherty amplifier according to claim 1, further comprising a distributor to divide a signal to be amplified into two, outputting one of the distributed signals to the first input circuit as the first signal and outputting the other one of the distributed signals to the second input circuit as the second signal.

3. The Doherty amplifier according to claim 1,
wherein one end of the compensation circuit is an open end at the first operation frequency, and
the compensation circuit resonates with the first output circuit at the second operation frequency to cancel the electrical length of the first output circuit.

4. The Doherty amplifier according to claim 1, further comprising:
a first matching circuit to change an input impedance of the first amplification element in place of the first input circuit having the electrical length of 180×n degrees at the first operation frequency; and
a second matching circuit to change an input impedance of the second amplification element in place of the second input circuit having an electrical length of 90 degrees at the second operation frequency,
wherein a phase of the first signal input to the first matching circuit is 90 degrees behind a phase of the second signal input to the second matching circuit at the first operation frequency and 45 degrees behind the phase of the second signal input to the second matching circuit at the second operation frequency.

5. A Doherty amplifier circuit comprising:
multiple Doherty amplifiers connected in parallel, the Doherty amplifiers each including:
a first input circuit having an electrical length of 180×n (n is an integer greater than or equal to 1) degrees at a first operation frequency of first and second signals that are signals to be amplified;
a second input circuit having an electrical length of 90 degrees at the first operation frequency;
a first amplification element to amplify the first signal that has passed through the first input circuit;
a second amplification element to amplify the second signal that has passed through the second input circuit;
a first output circuit having one end connected to an output terminal of the first amplification element, the first output circuit having an electrical length of 90 degrees at the first operation frequency;
a second output circuit having one end connected to an output terminal of the second amplification element and another end connected to another end of the first output circuit, the second output circuit having an electrical length of 180×n degrees at the first operation frequency;
a compensation circuit having one end connected to the other ends of the first and second output circuits and another end grounded, the compensation circuit having an electrical length of 90 degrees at the first operation frequency and an electrical length of 45 degrees at a second operation frequency which is half of the first operation frequency; and
a controller to switch between operating classes of the first and second amplification elements when operation frequencies of the first and second amplification elements are the first operation frequency and operating classes of the first and second amplification elements when the operation frequencies of the first and second amplification elements are the second operation frequency;
a distribution circuit to divide an input signal to multiple signals and outputting each of distributed signals, which are the divided input signals, as signals to be amplified to one of the multiple Doherty amplifiers; and
a combining circuit to combine signals output from the multiple Doherty amplifiers.

* * * * *